(12) United States Patent
Suzuki

(10) Patent No.: US 6,172,740 B1
(45) Date of Patent: Jan. 9, 2001

(54) PROJECTION EXPOSURE APPARATUS AND DEVICE MANUFACTURING METHOD

(75) Inventor: Akiyoshi Suzuki, Tokyo (JP)

(73) Assignee: Canon Kabushiki Kaisha, Tokyo (JP)

( * ) Notice: Under 35 U.S.C. 154(b), the term of this patent shall be extended for 0 days.

(21) Appl. No.: 09/339,371

(22) Filed: Jun. 24, 1999

(30) Foreign Application Priority Data

Jul. 1, 1998 (JP) ................................................. 10-201117

(51) Int. Cl.$^7$ ............................ G03B 27/42; G03B 27/54
(52) U.S. Cl. ................................................ 355/53; 355/67
(58) Field of Search ................................ 355/50, 53, 55, 355/67, 71, 77; 356/399–401; 250/548, 492.2, 492.22

(56) References Cited

U.S. PATENT DOCUMENTS

| 5,610,684 | * | 3/1997 | Shiraishi | 355/55 |
| 5,661,546 | * | 8/1997 | Taniguchi | 355/53 |
| 5,774,206 | * | 6/1998 | Sato | 355/67 |
| 5,789,734 | * | 8/1998 | Torigoe et al. | 250/201.2 |
| 5,822,043 | * | 10/1998 | Ebinuma | 355/55 |

FOREIGN PATENT DOCUMENTS 43-10034   12/1964   (JP).
10-242048  9/1998    (JP).

\* cited by examiner

*Primary Examiner*—Russell Adams
*Assistant Examiner*—Hung Henry Nguyen
(74) *Attorney, Agent, or Firm*—Fitzpatrick, Cella, Harper & Scinto

(57) ABSTRACT

A projection exposure apparatus includes a projection optical system for projecting a pattern of a mask onto a substrate, and a stage for the substrate arranged to be movable in directions X and Y each of which is perpendicular to an optical axis of the projection optical system and which are perpendicular to each other. The projection optical system has a pair of aspherical members, at least one of which is displaceable in a direction P which is perpendicular to the optical axis of the projection optical system and which differs from the directions X and Y. A shape of an aspheric surface of each of the pair of aspherical members is determined such that substantially only a refractive power of the pair of aspherical members functioning as one system obtained at a section including the direction P varies accordingly as a positional relation in the direction P between the aspheric surfaces of the pair of aspherical members varies. Substantially only a refractive power at the section of the projection optical system is varied by displacing the at least one of the pair of aspherical members in the direction P.

8 Claims, 8 Drawing Sheets

PROJECTION EXPOSURE APPARATUS AND DEVICE MANUFACTURING METHOD

BACKGROUND OF THE INVENTION

1. Field of the Invention

The present invention relates to a projection exposure apparatus and a method for manufacturing devices such as a semiconductor device including an IC or an LSI, an image pickup device including a CCD, a dispay device including a liquid crystal panel, a magnetic head, etc. The projection exposure apparatus and the device manufacturing method are advantageous for a case where any of these devices is to be manufactured by lithography to have a high degree of integration by projecting an electronic circuit pattern formed on the surface of a mask or a reticle (hereinafter referred to as a reticle) on a wafer through a projection optical system to carry out an exposure or a scanning-exposure action on the wafer. Particularly, the projection exposure apparatus and the device manufacturing method are advantageous for a case where a silicon wafer is to be exposed with an electronic circuit pattern of the reticle by precisely aligning and adjusting the position of the reticle and that of the wafer to each other to obtain a high degree of integration.

2. Description of Related Art

In manufacturing a semiconductor device, a liquid crystal element, etc., by photolithography, a projection exposure apparatus which is called a stepper is used. The projection exposure apparatus is arranged to carry out an exposure by projecting through a projection optical system a pattern formed on a reticle onto a photosensitive substrate which is a wafer or a glass plate coated with a photoresist or the like.

The art of manufacturing semiconductor devices to have a minute and fine circuit pattern has saliently advanced of late. Efforts are being made to have a circuit pattern more minutely defined, for example, down to such a line width measuring less than 0.25 $\mu$m. In respect of those efforts, an art of making optical exposures typically embodied in the stepper is playing the most important role. The performance of a projection lens, i.e., a projection optical system, which is usable as an index for the performance of the art of optical exposure, is considered roughly in three aspects, including a shorter wavelength, a larger image plane and a larger NA (numerical aperture). With respect to having a shorter wavelength, efforts are now ardently exerted to develop as a technique of the next generation a lithographic art of using a laser beam which is obtainable from an ArF excimer laser.

The optical exposure method for manufacturing semiconductor elements (devices) are required to satisfy various factors (requirements) which include, besides a high resolution, a high degree of precision of positional alignment, i.e., position adjustment to each other, of patterns to be superposed on each other in many layers.

Of known position adjusting methods for this purpose, a method called "global alignment" is popularly in use. The error to be made by the global method can be roughly divided into two error components. One is an intershot error component which is an error between one printing shot (exposure shot) and another and an intrashot error component which is an error made within each shot of exposure. Since the size of an image plane is tending to become larger of late, how to suppress the intrashot error component is a serious problem these days.

For example, if there is an error of 2 ppm with respect to magnification or perpendicularity for an image plane size of 22 mm, the alignment error becomes as follows:

22 mm×2 ppm=44 nm.

The value of this error alone is nearly 1/5 times as much as the resolution performance of a line width of 0.25 $\mu$m. In view of a budget for superposition, this value is clearly beyond an allowable limit. It is, therefore, a serious problem for the art of optical exposure to suppress the intrashot error component.

In order to improve the precision of positional alignment of the patterns to be superposed on each other, therefore, the intrashot error component must be adequately controlled. Meanwhile, the projection optical system used for the stepper generally has a function of correcting only such components that are rotationally symmetric with respect to an optical axis.

However, in the actual processes in the manufacture of a semiconductor device, magnifying rates of expansion and contraction of the wafer caused by processes in the x and y directions, i.e., horizontal and vertical directions, sometimes vary and fluctuate among the results of these processes according to the directivity of patterns to be printed. The fluctuations of the rates of expansion and contraction impose some limitation on the efforts to improve the precision of the overall position alignment. As regards the arrangement for correcting the rates of vertical and horizontal expansion and contraction independently of each other, a stepper disclosed in Japanese Laid-Open Patent Application No. Hei 10-242048 is arranged to make correction by shifting an aspheric surface.

Another important subject for improvement in the precision of alignment lies in factors on the side of the reticle. One of the main factors on the side of the reticle is the perpendicularity of a pattern formed on the reticle. The perpendicularity error is not caused by an exposure apparatus or by a wafer process but is caused by fluctuations of the perpendicularity of a reticle pattern drawing apparatus.

BRIEF SUMMARY OF THE INVENTION

It is an object of the invention to provide a projection exposure apparatus arranged to project on the surface of a wafer a pattern formed on a reticle and to permit control over the perpendicularity of the pattern obtained on the reticle as a rotationally asymmetric correction component, and also to provide a method for manufacturing devices with the projection exposure apparatus.

To attain the above object, in accordance with an aspect of the invention, there is provided a projection exposure apparatus, comprising a projection optical system for projecting a pattern of a mask on a substrate, and a stage for the substrate arranged to be movable in directions X and Y each of which is perpendicular to an optical axis of the projection optical system and which are perpendicular to each other, wherein the projection optical system has a pair of aspherical members, at least one of which is displaceable in a direction P which is perpendicular to the optical axis of the projection optical system and which differs from the directions X and Y, wherein a shape of an aspheric surface of each of the pair of aspherical members is determined such that substantially only a refractive power of the pair of aspherical members functioning as one system obtained at a section including the direction P varies accordingly as a positional relation in the direction P between the aspheric surfaces of the pair of aspherical members varies, and wherein substantially only a refractive power at the section of the projection optical system is varied by displacing the at least one of the pair of aspherical members in the direction P.

In the projection exposure apparatus in accordance with another aspect of the invention, the pair of aspherical members are displaceable as much as the same amount in respective opposite directions.

In the projection exposure apparatus in accordance with a further aspect of the invention, the pair of aspherical members are integrally rotatable around a rotation axis being the optical axis of the projection optical system.

In the projection exposure apparatus in accordance with a further aspect of the invention, the projection optical system has a function of varying a magnification thereof in an isotropic manner.

In the projection exposure apparatus in accordance with a further aspect of the invention, the direction P is at an angle of not less than 10 degrees and not greater than 80 degrees with respect to each of the directions X and Y.

In accordance with a further aspect of the invention, there is provided a device manufacturing method, comprising a process of transferring a device pattern of the mask to the substrate by using the projection exposure apparatus.

The above and further objects and features of the invention will become apparent from the following detailed description of preferred embodiments thereof taken in conjunction with the accompanying drawings.

DETAILED DESCRIPTION OF THE INVENTION

Hereinafter, preferred embodiments of the invention will be described in detail with reference to the drawings.

Figure 1A:
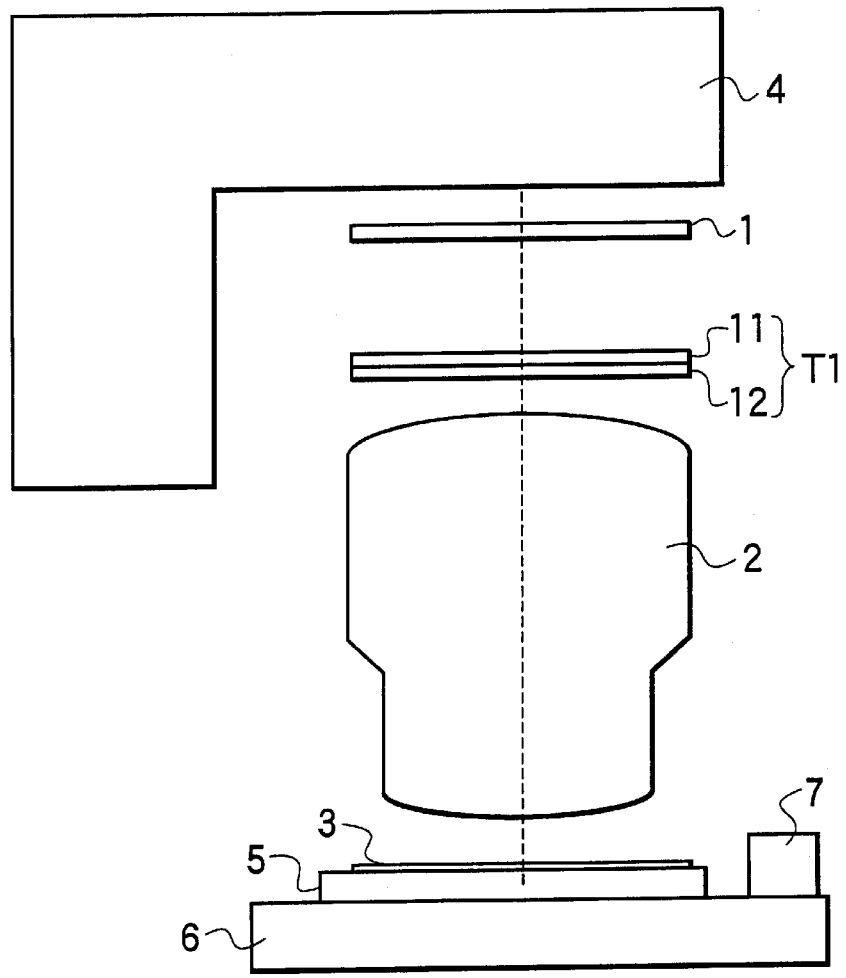
FIG. 1(A) schematically shows essential parts of a projection exposure apparatus according to a first embodiment of the invention.

FIG. 1(A) schematically show essential parts of a projection exposure apparatus according to a first embodiment of the invention. In the case of the first embodiment, the invention is applied to a step-and-repeat type stepper (projection exposure apparatus).

Referring to FIG. 1(A), an exposure illumination system 4 is arranged to illuminate a reticle (mask) 1. The exposure illumination system 4 is composed of a light source which is one of an ArF excimer laser (wavelength 193 nm) or a KrF excimer laser (wavelength 248 nm) and a lamp for emitting either g beams (436 nm) or i beams (365 nm), and a known optical system.

The reticle (mask) 1 is prepared with a circuit pattern drawn on a glass substrate. An optical system 2 included in a projection optical system is of a refraction type or a catadioptric type and is arranged to project, on a wafer 3 which is a substrate to be exposed, the circuit pattern of the reticle 1 illuminated by the exposure illumination system 4. Optical means T1 is arranged to be capable of varying on the wafer 3 the perpendicularity and the aspect ratio of the circuit pattern of the reticle 1.

The optical means T1, which is also included in the projection optical system, is composed of two optical elements 11 and 12 which have aspheric surfaces of the same shape and are made of a quartz or fluorite material. The optical means T1 is disposed between the optical system 2 and the reticle 1. The projection optical system, which includes the optical means T1 and the optical system 2, is arranged to be capable of, by using the optical means T, projecting the pattern of the reticle 1 at different magnifications respectively with respect to first and second directions which are perpendicular to each other, and is also arranged to be capable of, by using the optical means T, varying the difference between the two different magnifications.

A wafer holder 5 is arranged to hold the wafer 3. A wafer stage 6 is arranged to have the wafer holder 5 mounted thereon and to be driven in a known manner, such as x, y, z driving, θ driving, tilting driving, etc.

An interference mirror 7 is provided for monitoring the position of the wafer stage 6 with a laser interferometer which is not shown. The wafer 3 is set in position by means of a wafer stage driving control system (not shown) according to signals obtained from the mirror 7 and the interferometer. A projection exposure is carried out with the wafer 3 thus set in position.

In a case where the first embodiment is a scanning type stepper, i.e., a scanning type projection exposure apparatus, the scanning exposure is made by moving the wafer stage 6 and a reticle stage (not shown), which carries the reticle 1, in directions perpendicular to the optical axis of the projection optical system 2 at a rate of speed corresponding to the image forming magnification of the projection optical system 2.

The stepper according to the first embodiment of the invention is characterized by the provision of the optical means T1 and a driving means (not shown) which is arranged to drive the optical means T1. All other basic parts of arrangement are the same as an ordinary stepper or an ordinary scanning type stepper.

In the first embodiment, the projection optical system 2 may be either of a refracting type or of a catadioptric type. The projection optical system 2 is provided with a magnification (projection magnification) control function. Known methods for magnification control include a method of shifting a lens within the projection optical system in the direction of the optical axis, and a method of controlling pressure within a space at a part of the projection optical system. Either of the methods is adoptable according to the invention. The magnification of the projection optical system 2 is controlled by that method in a manner rotationally symmetric with respect to the optical axis.

The actual semiconductor device manufacturing processes are more than 20 in number. Therefore, the number of reticles is also more than 20. A drawing work on the reticle is performed by a reticle pattern drawing apparatus which is arranged to use either electron beams or laser beams. In either case, the reticle pattern drawing apparatus exposes a whole image plane to the beams by driving an XY stage to move the reticle substrate to each drawing position. Reference mirrors which are provided on the stage for X and Y directions are used as the reference for driving the XY stage. The perpendicularity of the reference mirrors fluctuates due to thermal variations of the apparatus and is, therefore, one of daily management items of the reticle pattern drawing apparatus.

The perpendicularity of the pattern of the reticle 1 is controlled to be within an allowable range of ±1 μrad or thereabout. A value severer than 1 μrad would necessitate more frequent checking and improvement in accuracy of inspection and is, therefore, considered to be hardly practicable at present. With more than 20 reticles used, the date of preparation of the reticles usually varies. Results of tests showed that the patterns of the reticles prepared not within one and the same day might differ from each other in perpendicularity up to an extent of 2 μrad. It has been hardly possible to correct the perpendicularity errors of reticle patterns with an ordinary optical system. Hence, an ultimate pattern error obtained on the wafer after superposing reticle patterns one upon another has included some perpendicularity error of reticle patterns remaining uncorrected.

To solve the above problem, the first embodiment has the optical means T1, which is composed of the pair of aspherical optical elements 11 and 12, inserted in a part of the optical path of the projection optical system. Then, the positional relation between the aspherical optical elements 11 and 12 in the direction which is perpendicular to the optical axes of the projection optical system is varied and adjusted, so that the perpendicularity of reticle patterns on the wafer is corrected so as to coincide with the perpendicularity of shot areas (pattern areas) on the wafer.

Figure 1B:
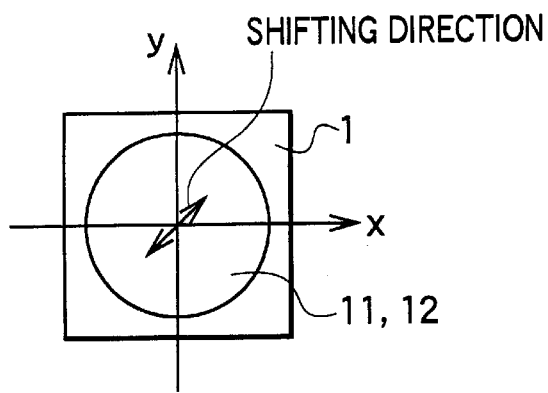
FIG. 1(B) shows a positional relation between a reticle and a pair of optical elements in the projection exposure apparatus shown in FIG. 1(A).

For the above-stated purpose, as shown in FIG. 1(B), one of the pair of the aspherical optical elements 11 and 12 is shifted by a certain amount in a direction which does not coincide with the X and Y directions used in designing a semiconductor device pattern on a CAD. Accordingly, the perpendicularity fluctuations taking place on the reticle at the time of the actual manufacture of a semiconductor device are corrected by imparting anisotropy to the magnification of the projection optical system (the optical system 2 and the optical means T1).

Figure 2A:
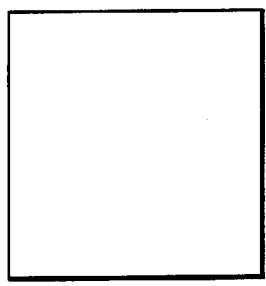
FIGS. 2(A) to 2(D) are diagrams for explaining a perpendicularity error correction method according to the invention.
Figure 2B:
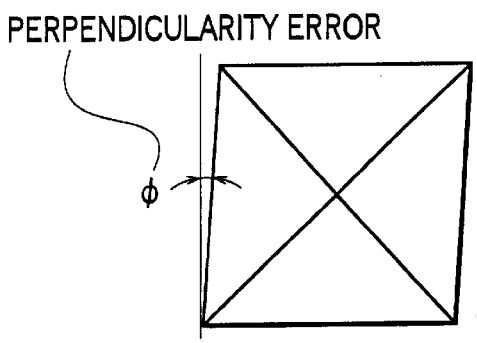

FIGS. 2(A) to 2(D) are diagrams for explaining the allocation of a pattern (outline shape of a pattern area) on the reticle when the perpendicularity error takes place. FIG. 2(A) shows a reference pattern, or a pattern area of the wafer, to be used as a reference. The reference pattern is expediently shown as a square having no error in perpendicularity. FIG. 2(B) shows the allocation of a pattern (outline shape of a pattern area), drawn by another process, on the reticle, which is to be adjusted to the pattern shown in FIG. 2(A). In the case of FIG. 2(B), perpendicularity has been changed due to some fault existing on the side of the reticle pattern drawing apparatus. The changed perpendicularity has caused a pattern (area) which should be in the same square shape as the shape shown in FIG. 2(A) to be in a parallelogram, i.e., a rhombic shape.

When the patterns shown in FIGS. 2(A) and 2(B) are superposed on each other, there appears an overlay error resulting from the change of perpendicularity. The perpendicularity error cannot be corrected by he conventional optical system arranged to be rotationally symmetric with respect to an optical axis. In order to correct the perpendicularity error, it is necessary to arrange an optical system to have some anisotropy within a plane perpendicular to the optical axis.

Figure 2C:
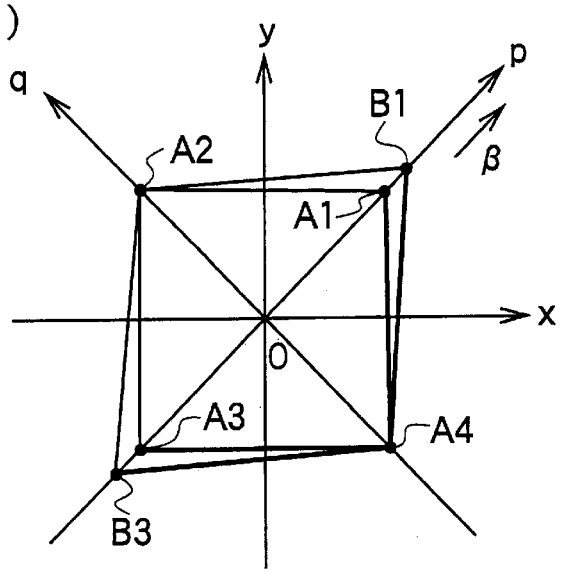

FIG. 2(C) is a diagram for explaining the correction of the perpendicularity error of a reticle pattern according to the invention. First, diagonal lines are drawn for analyzing the pattern of FIG. 2(B) having the perpendicularity error. While diagonal lines in the pattern of FIG. 2(A) are equal to each other as the pattern is a square, diagonal lines in the pattern of FIG. 2(B) become different from each other as the pattern is a rhombus. Axes x and y are taken in the directions passing the center of the square and parallel with each side of the square. Axes p and q are taken in the diagonal directions, i.e., in the directions of ±45 degrees. Then, if the magnification only in the direction of the axis p is multiplied by β, a pattern similar to the pattern of FIG. 2(B) can be obtained. The value of β can be expressed as follows:

$$\beta = 1 + \gamma$$

where γ is a very small value on the order of several ppm.

In the system shown in FIG. 2(C), a means for varying magnification in one direction is arranged to have its variable direction coincide with the axis p and to multiply the magnification in the direction of the axis p by β. Further, in this instance, the pattern is assumed to be corrected in such a way as to cause the side of the pattern in the direction of the axis x to be horizontal.

Figure 2D:
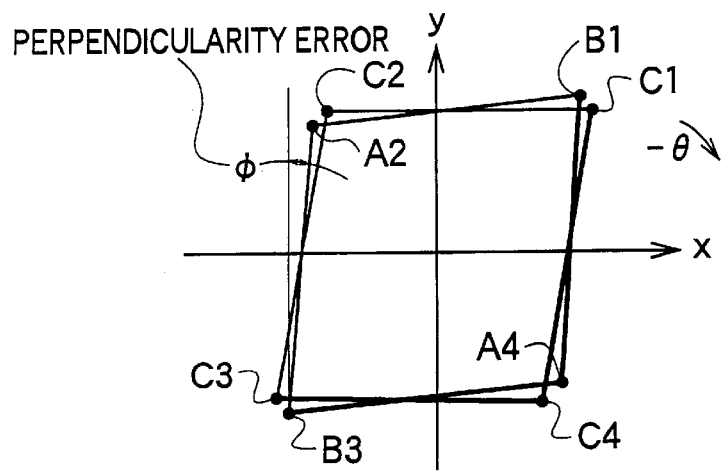

FIG. 2(D) shows a case where there is a rotation error as well as the perpendicularity error. If the pattern remains in the state shown in FIG. 2(C), it differs from a state of FIG. 2(D) in the magnification and the rotation. However, the state of FIG. 2(C) and the state of FIG. 2(D) can be made to coincide with each other by adjusting the magnification of the projection optical system and also by rotating the reticle itself. The pattern of FIG. 2(B), therefore, can be perfectly adjusted to the pattern of FIG. 2(A) by reversely carrying out this adjusting process.

Next, a process for deforming the square pattern of FIG. 2(A) into the rhombic pattern which is as shown in FIG. 2(B) is next described. Here, apex points in the respective quadrants of the square are respectively assumed to be denoted by A1, A2, A3 and A4 according to the numbers of the quadrants. The coordinates of the apex points are as shown below:

$$A1: (a, a)\ A2: (-a, a)\ A3: (-a, -a)\ A4: (a, -a)$$

When the magnification in the direction of the axis p is multiplied by β, the point A1 shifts to a point B1 and the point A3 shifts to a point B3, while the points on the axis q remain unchanged. The coordinates of the points B1 and B3 are as shown below:

$$B1: (a\beta, a\beta)\ B3: (-a\beta, -a\beta)$$

The rotation θ which is caused by multiplying the magnification in the direction of the axis p by β can be obtained from an angle between the points B1 and A2, as expressed below:

$$\theta = (a\beta - a)/2a = (\beta - 1)/2 = \gamma/2$$

When the rhombus B1-A2-B3-A4 is rotated by an angle $-\theta$ around the optical axis as shown in FIG. 2(D), the rhombus B1-A2-B3-A4 changes into a rhombus C1-C2-C3-C4. The coordinates of the points C1, C2, C3 and C4 are as shown below:

$C1: \{a\beta(1+\gamma/2), a\beta(1-\gamma/2)\}$ $C2: \{a(-1+\gamma/2), a(1+\gamma/2)\}$ $C3: \{-a\beta(1+\gamma/2), -a\beta(1-\gamma/2)\}$ $C4: \{a(1-\gamma/2), -a(1+\gamma/2)\}$ A difference between the coordinates of the point C1 and those of the point C2 in the direction of the axis y is as expressed below:

$$a\beta(1-\gamma/2) - a(1+\gamma/2) = -a\gamma^2/2 \approx 0$$

Since the term of the square of $\gamma$ of the order of several ppm is a very small value, the sides of the pattern in the direction of the axis x become horizontal. Further, the perpendicularity $\phi$ occurring in the pattern is expressed as follows:

$$\phi = \{a\beta(1+\gamma/2) - a(1-\gamma/2)\}/2a = \gamma(3+\beta)/4 \approx \gamma$$

In other words, a pattern having a perpendicularity rate $\gamma$ can be obtained by multiplying the magnification in the direction of the axis p of the square pattern by $\beta(=1+\gamma)$ and by rotating the pattern as much as $-\gamma/2$. Here, a difference between the coordinates of the point C1 and those of the point C2 in the direction of the axis x is as expressed below:

$$a\beta(1+\gamma/2) - \{-a(1-\gamma/2)\} \approx a(\beta+1) = a(2+\gamma)$$

As compared with the initial difference "$2a$" between the coordinates of the point A1 and those of the point A2 in the direction of the axis x, the difference between the coordinates of the point C1 and those of the point C2 in the direction of the axis x becomes larger by $(1+\gamma/2)$ times. In a case where the patterns are superposed on each other in such a way as to set the difference between the x coordinates of the points A1 and A2 to "$2a$", an overall correction is made as much as $(1-\gamma/2)$ times by using a rotationally-symmetric variable magnification correcting function, because the shapes of the patterns have already become similar to each other.

Conversely, a pattern having the perpendicularity $\gamma$, as the pattern of FIG. 2(B), can be changed into the square pattern of FIG. 2(A) by multiplying by $(1-\gamma)$ the magnification in the direction of the axis p and by rotating the pattern as much as $\gamma/2$. At that time, some magnification error might be caused in the horizontal direction by the generation of the perpendicularity error. In that event, the magnification is adjusted, for example, by multiplying it by $(1+\gamma/2)$ with a known rotationally-symmetric magnification adjusting mechanism. A numerical example of this adjustment is described as follows. With the length in the horizontal direction assumed to be "A1–A2=B1–B2" and the pattern of FIG. 2(B) assumed to have a perpendicularity error of 2 ppm, the magnification in the direction of the axis p in the rhombic shape of FIG. 2(B) is made smaller by 1 ppm, the reticle is rotated as much as 1 $\mu$rad, and the total rotationally-symmetric magnification is made larger by 1 ppm. By this adjustment, the pattern of FIG. 2(B) can be accurately adjusted to the square shape of FIG. 2(A). In this example, the values expressed in ppm correspond to rotation amounts expressed in $\mu$rad.

Subsequently, a practical optical system in the first embodiment is described below. The first embodiment is characterized in that a rotationally-asymmetric optical characteristic, i.e., anisotropy, is generated in the optical system by means of the pair of optical elements 11 and 12. To the anisotropy generating element is applied, for example, the arrangement of a lateral-shifting optical-power control element disclosed in Japanese Patent Publication No. Sho 43-10034. FIG. 1(A) shows the state where such optical elements 11 and 12 are used for the projection optical system of the projection exposure apparatus according to the first embodiment.

Figure 3:
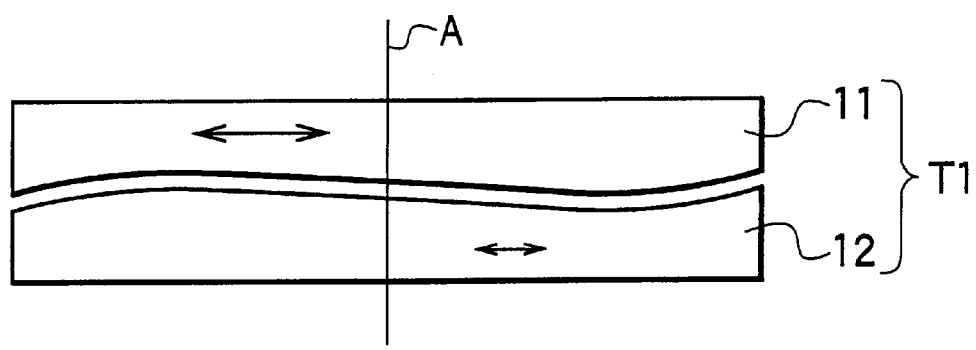
FIG. 3 is a diagram for explaining optical means according to the invention.

FIG. 3 shows by way of example the practical arrangement of the optical means T1, which is composed of the pair of optical elements 11 and 12. The optical elements 11 and 12, which are arranged to confront each other, have flat outside surfaces and have the confronting surfaces in aspherical shapes identical with each other. The relative positions of the optical elements 11 and 12 are arranged to be shifted in the direction perpendicular to an optical axis A, as shown in FIG. 3. The axes p and q of the optical means T1 are arranged to be at an angle of 45 degrees with respect to the axes x and y of the reticle pattern. Assuming that the aspheric surface of the optical element 11, which is one of the confronting aspheric surfaces, is expressed as fa(p, q) and the aspheric surface of the other optical element 12, which is the other of the confronting aspheric surfaces, is expressed as fb(p, q), then both aspheric surfaces can be expressed by the following cubic expressions of x which are the same as each other with the exception of constant terms:

$$fa(p, q) = ap^3 + bp^2 + cp + d1$$

$$fb(p, q) = ap^3 + bp^2 + cp + d2 \tag{1}$$

The formulas (1) described above include no term relative to the axis q, for the purpose of giving an optical power only in the direction of the axis p. The optical elements 11 and 12 are arranged to have their relative positions shifted in the direction of the axis p. In order to generate the optical power by laterally shifting them, the cubic term of p is indispensable for the shapes of the aspheric surfaces.

In the initial stage of the adjustment, the aspheric surfaces fa(p, q) and fb(p, q) cancel (offset) each other by their concavity and convexity. Therefore, in the initial stage, the optical elements 11 and 12 act nothing more than as parallel flat-surfaced plates. A distance between the optical elements 11 and 12 must be as small as possible and is, for example, preferably about 10 $\mu$m. Now, assuming that the optical element 11 is moved as much as a shifting amount $\Delta$ in the direction of the axis p, a change brought about by this movement can be expressed as follows:

$$fa(p+\Delta, q) - fb(p, q) = \tag{2}$$

$$3a\Delta p^2 + 2b\Delta_p + c\Delta + (d1-d2) + 3a\Delta^2 p + b\Delta^2 + a\Delta^3$$

Here, the higher order terms of the shifting amount $\Delta$ are assumed to be negligible, as the shifting amount $\Delta$ represents a very small amount, and the following condition is assumed to apply:

$$b = c = 0 \tag{3}$$

Accordingly, the formula (2) can be simplified as shown below:

$$fa(p+\Delta, q)-fb(p, q)=3a\,\Delta p^2+(d1-d2) \quad (4)$$

It is a fundamental feature of the invention that the term of the square of p is included in the formula (4). The optical elements 11 and 12 are, there-ore, caused to become an element having its power only in the direction of the axis p. This power can be controlled as desired by adjusting the shifting amount Δ. The process of obtaining a difference by shifting the positions of the optical elements 11 and 12 relative to each other is nothing else but a differential operation. Therefore, with some cubic component included in their aspherical shapes, the optical elements 11 and 12 are arranged to act to obtain a power-imparting quadratic component by a differential effect.

While the formula (3) is shown as "b=c=0" for the sake of simplification, a term "2b Δp" in the formula (2) represents a shifting amount. Since the shifting amount Δ is arranged to be of a known value for the purpose of control over the optical power, the shifting amount can be corrected as desired. It is at the time of alignment that a shift presents a problem. A problem due to a shift which results from the adjustment of the relative positions of the optical elements 11 and 12 can be solved by instructing the wafer stage 6 to reversely correct the shift. Further, giving an opposite value to the term of "c" effectively reduces the absolute value of a shift of the aspheric surface from a flat surface. Depending on the value of "a", therefore, making the terms of "b" and "c" arbitrary values other than zero also effectively solves the problem. In actuality, in order to minimize the value of the aspherical amount, it is preferable to make the term of "b" zero and to give to the term of "c" a value of a sign which is opposite to the sign of "a".

The absolute value of the aspherical amount actually required in correcting such a small value that is only 2 ppm or 2 μrad or thereabout is extremely small. Although it also depends on the positions where the optical elements 11 and 12 are to be set, the aspherical amount corresponds to several lines of Newton rings. For example, in a case where an aspherical amount to be generated as a power component is several lines and is thus assumed to be 1 μm, the lens diameter is assumed to be 200 mm and the shifting amount Δ is assumed to be 5 mm, the aspherical amount is obtained from the formula (4), as follows:

$$3a \times 5 \times 100 \times 100 = 0.001$$

Then, the value of "a" becomes as follows:

$$a = 6.7 \times 10^{-9}$$

Since the lens diameter is 200 mm, the value "100" represents the value of the lens radius. Assuming that b=c=0, the value of the aspherical amount is obtained from the formula (1), as follows:

$$6.7 \times 10^{-9} \times 100 \times 100 \times 100 = 6.7 \times 10^{-3}$$

In this case, therefore, the original aspherical amount of each of the optical elements 11 and 12 is ±6.7 μm. In order to make the actual amount of deviation from a flat surface smaller, the term of "c" is preferably added to the above value. The value of "c" which gives the value 6.7 μm at the radius 100 mm is "$6.7 \times 10^{-5}$". Therefore, with the signs of the values "a" and "c" arranged to be opposite to each other, the value of "c" becomes as follows:

$$c = -6.7 \times 10^{-5}$$

With the value of "c" set to this value, the aspherical amount deviating from a flat surface can be reduced down to a value ±2.6 μm.

Figure 4:
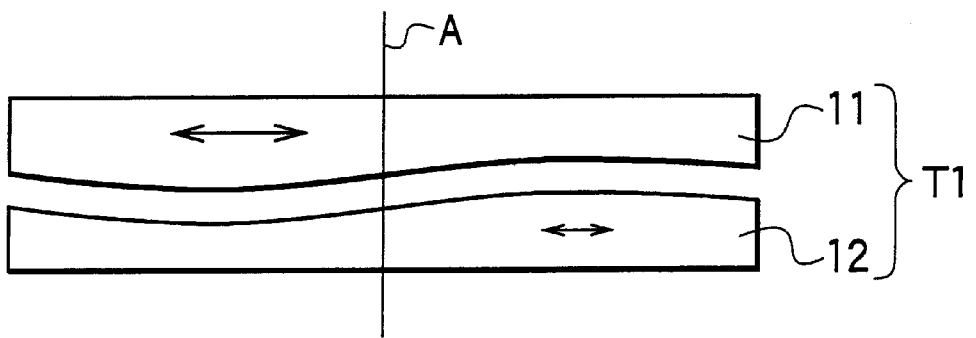
FIG. 4 is a diagram for explaining optical means according to the invention.

FIG. 3 shows the shapes of the aspheric surfaces obtained when the value of "c" is zero. FIG. 4 shows the shapes of the aspheric surfaces obtained when the value of "c" is the value described above. The aspheric surfaces are in relatively moderate shapes within the diameter of 200 mm. Besides, the optical elements 11 and 12 are in shapes which are complementary to each other. Therefore, other optical performances are little affected by the amount of any aberration that is generated by changes of the relative positions of the optical elements 11 and 12, so that only the magnification can be minutely corrected.

In the case of the foregoing description, the shifting amount Δ is applied to the optical element 11 only. However, the same advantageous effect can be attained also by moving both the optical elements 11 and 12 symmetrically with respect to the optical axis by the same amount in respective opposite directions, i.e., by moving one by the amount of +Δ/2 and the other by the amount of −Δ/2.

The rotationally-asymmetric magnification correcting amount to be used in correcting an error of reticle preparation is several ppm or several μrad at the most. The data of the correction amount is set as a parameter, for example, by inputting the data to the projection exposure apparatus. Then, the relative positions of the aspherical optical elements 11 and 12 are adjusted on the basis of the set parameter by a driving mechanism which is not shown. The projection exposure apparatus is, set in this manner. It is of, course, possible to set the parameter by providing the reticle with a perpendicularity measuring reference mark and by inputting directly to the projection exposure apparatus a value automatically measured by reading the reference mark on the side of the projection exposure apparatus.

Since a circuit design for a semiconductor device is made by a CAD method with an x-y coordinate system, it is preferred that the above-stated directions p and q perpendicular to the optical axis do not coincide with the directions x and y of the CAD and are, for example, directions of 45 degrees as shown in FIG. 2(C). The directions x and y generally coincide with the directions of the end faces of the reticle. Therefore, the directions x and y of the optical elements 11 and 12 coincide with the directions of the end faces of the reticle. The directions x and y coincide with the directions x and y of the movement of the wafer stage 6, so that these directions can be correlated to x and y magnifications obtained in performing the global alignment.

Since a perpendicularity component to be corrected is of a small value, a magnification correcting amount which is to be generated and is rotationally asymmetric with respect to the optical axis is also small, so that the aspherical amount to be used can be made smaller to such an extent that can be easily measured by the interferometer. This is another advantage of the invention. Since a desired optical performance can be attained by shifting the relative positions of the two aspheric surfaces, the original aspherical amounts of the optical elements 11 and 12 are made larger by almost one place than their final shapes desired. In the case of the example given above, an aspheric surface of 6.7 μm is necessary for obtaining a value of 1 μm. It is a key point of the invention that the aspherical amount is reduced to 2.6 μm by optimizing inclination to bring the correcting amount into a high-precision measuring range of the interferometer. In preparing an aspheric surface, it is important to make it possible to measure the surface to determine whether the surface has been accurately machined into a desired shape. An amount which is about the same as the above-stated aspherical amount according to the invention can be adequately measured by the currently available level of technology.

A command for driving and shifting the relative positions of the aspheric surfaces adopted according to the invention can be given either manually or on the basis of an actually measured value of the reticle as mentioned above. The correction is carried out immediately in the case of the manual correction. In the case of the global alignment, the correction is carried out when the driving mechanism is instructed by a CPU, which controls the whole projection exposure apparatus, immediately before an exposure action after a correction amount is computed upon completion of the measurement.

Figure 5A:
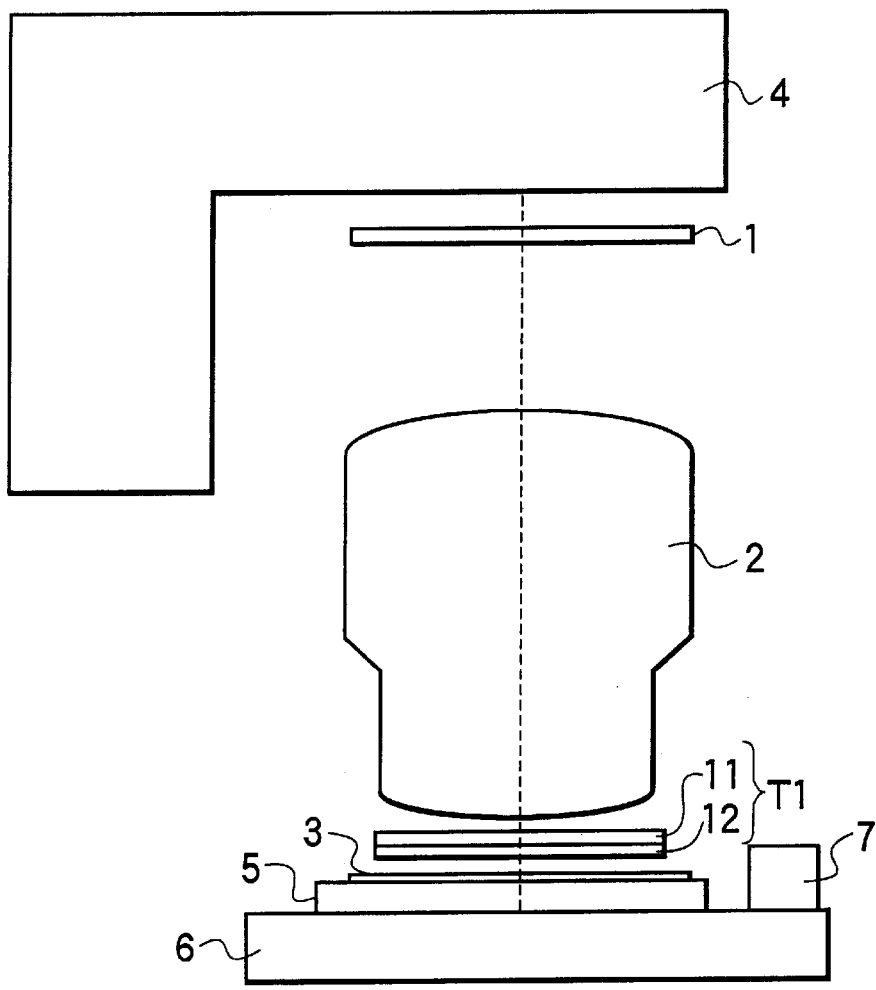
FIG. 5(A) schematically shows essential parts of a projection exposure apparatus according to a second embodiment of the invention.
Figure 5B:
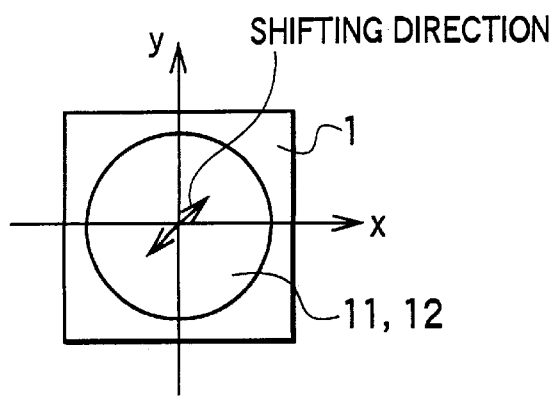
FIG. 5(B) shows a positional relation between a reticle and a pair of optical elements in the projection exposure apparatus shown in FIG. 5(A).

FIG. 5(A) schematically shows essential parts of a projection exposure apparatus according to a second embodiment of the invention, and FIG. 5(B) shows a positional relation between a reticle and a pair of optical elements in the projection exposure apparatus shown in FIG. 5(A). The second embodiment is arranged in the same manner as the first embodiment except that the optical means T1 is disposed between the projection optical system 2 and the wafer 3.

The optical means T1, which has the aspheric surfaces arranged according to the invention, thus can be inserted in one of various places in the optical path of the projection optical system. However, the magnification correcting range might be limited depending on the inserted position of the optical means T1.

It is an important feature of the invention to arrange the correcting direction of the rotationally-asymmetric magnification correcting function to directions which differ from the axes x and y. For the sake of simplification of description, the axes p and q are set to the directions deviating ±45 degrees from the axes x and y. However, the axes p and q may be set to any desired directions so long as they do not coincide with the axes x and y. Further, the rotationally-asymmetric magnification correcting amount, the rotation angle and the rotationally-symmetric magnification correcting amount in any of such directions can be computed. In a practical application, however, the axes p and q are preferably set to directions included within a range of ±10 to 80 degrees from the axes x and y.

Further, in the foregoing, the correction of the perpendicularity error of the reticle has mainly been described. However, such an anisotropy correcting method disclosed is applicable also to distortion matching between different apparatuses or between different exposure modes (the illuminating conditions or the modes of setting the NA of the projection optical system) of one and the same apparatus. Further, conceivable factors of overlay errors include, for example, an asymmetric magnification of the wafer. The provision of such a perpendicularity magnification correcting function that includes a function of correcting the asymmetric magnification of the wafer in addition to the function of correcting the perpendicularity of the reticle pattern would further enhance the precision of alignment.

Figure 6A:
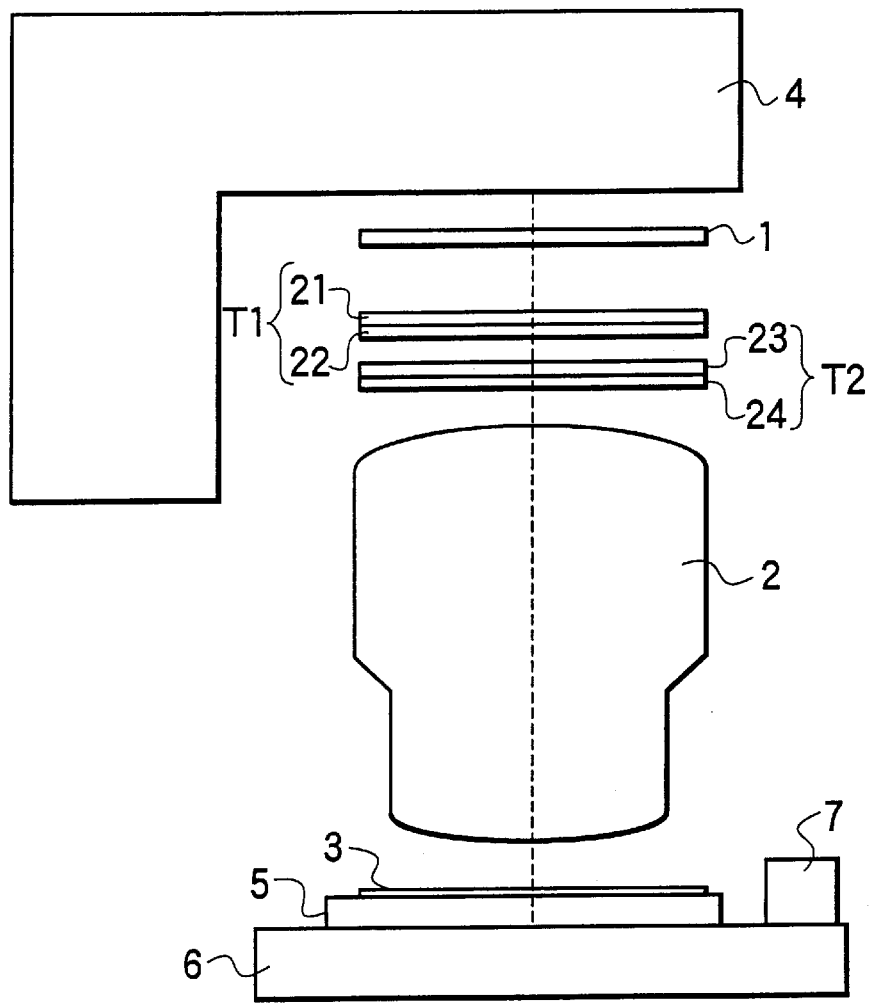
FIG. 6(A) schematically shows essential parts of a projection exposure apparatus according to a third embodiment of the invention.
Figure 6B:
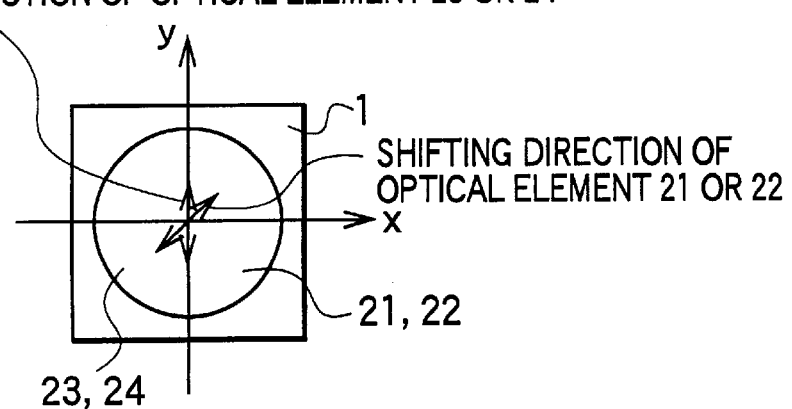
FIG. 6(B) shows a positional relation between a reticle and two pairs of optical elements in the projection exposure apparatus shown in FIG. 6(A).

FIG. 6(A) schematically shows essential parts of a projection exposure apparatus according to a third embodiment of the invention, and FIG. 6(B) shows a positional relation between a reticle and two pairs of optical elements in the projection exposure apparatus shown in FIG. 6(A). The third embodiment is arranged in the same manner as the first embodiment except in the following point. In the case of the third embodiment, the projection optical system having a function of correcting a rotationally-symmetric magnification or a distortion is provided with optical means T1 composed of optical elements 21 and 22 which function to correct the magnification in the direction of the axis p and optical means T2 composed of optical elements 23 and 24 which function to correct the magnification in the direction of the axis y. The two optical means T1 and T2 are disposed between the projection optical system 2 and the reticle 1. The addition of these correcting functions further increases the precision of overlay alignment.

Figure 9B:
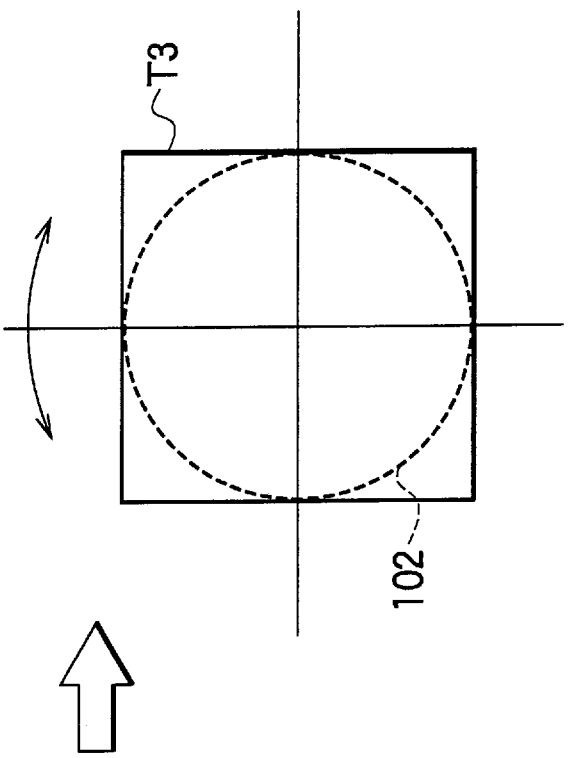
FIGS. 9(A) and 9(B) schematically show essential parts of another embodiment of the invention.

In each of the embodiments described above, the directions in which the relative positions of a pair of aspheric surfaces are shifted to correct the error of perpendicularity are fixed. A further embodiment of the invention shown in FIGS. 9(A) and 9(B) is arranged, on the other hand, to have a function of rotating the shifting directions of the aspheric surfaces in addition to the function of varying the power in the specific directions.

Figure 9A:
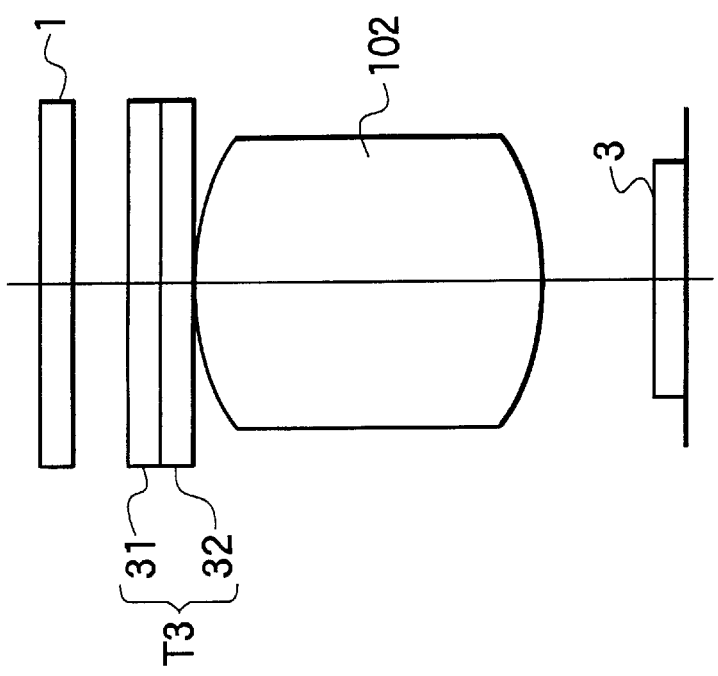

Referring to FIG. 9(A), optical means T3 is composed of a pair of aspherical optical elements 31 and 32 which have their positions arranged to be adjustable relative to each other in the same manner as described in the foregoing. The optical means T3 is disposed between a projection optical system 102 and a reticle 1 in the same manner as in the first embodiment. Further, the shifting directions of the pair of aspherical optical elements 31 and 32 are arranged to be variable to any desired directions, as indicated by arrows in FIG. 9(B), by causing a rotating mechanism (not shown) to rotate the optical means T3 around an optical axis of the projection optical system 102.

Since the shifting directions are variable, the direction in which to vary the magnification is also variable. Thus, the perpendicularity error of the reticle pattern and also the difference between the vertical and horizontal magnifications of the wafer resulting from a wafer processing action can be both corrected by one and the same optical means. The angle of rotation of the optical means T3 is decided either on the basis of a measured value obtained by an alignment detecting system provided as a measuring system of the projection exposure apparatus or by providing the projection exposure apparatus with some measured value that is obtained separately from the projection exposure apparatus. For example, in a case where the perpendicularity error of the reticle pattern is negligibly small, the shifting direction is adjusted in such a way as to correct the difference between the vertical and horizontal magnifications of the wafer according to the value measured by the alignment detecting system.

In a case where the difference between the vertical and horizontal magnifications of the wafer is detected by the alignment detecting system and the reticle pattern is also found to have a perpendicularity error, a direction or directions in which an overall error can be minimized are found by a computing operation, and the pair of aspheric surfaces are decided to be shifted in the computed direction.

Further, in each of the embodiments described above, the aspherical optical elements of the optical means T1, T2 or T3 may be arranged not only to be displaced relative to each other in the direction perpendicular to the optical axis of the projection optical system but also to be rotated. In addition, the optical means may be arranged to be composed of toric lenses (including cylindrical lenses) and to be displaced in the direction perpendicular to the optical axis and/or to be rotated.

In the case of such an arrangement, the pattern image can be easily changed into a desired shape which differs from the shape of the reticle pattern.

A semiconductor-device manufacturing method using the projection exposure apparatus described above is next described also as a further embodiment of the invention.

Figure 7:
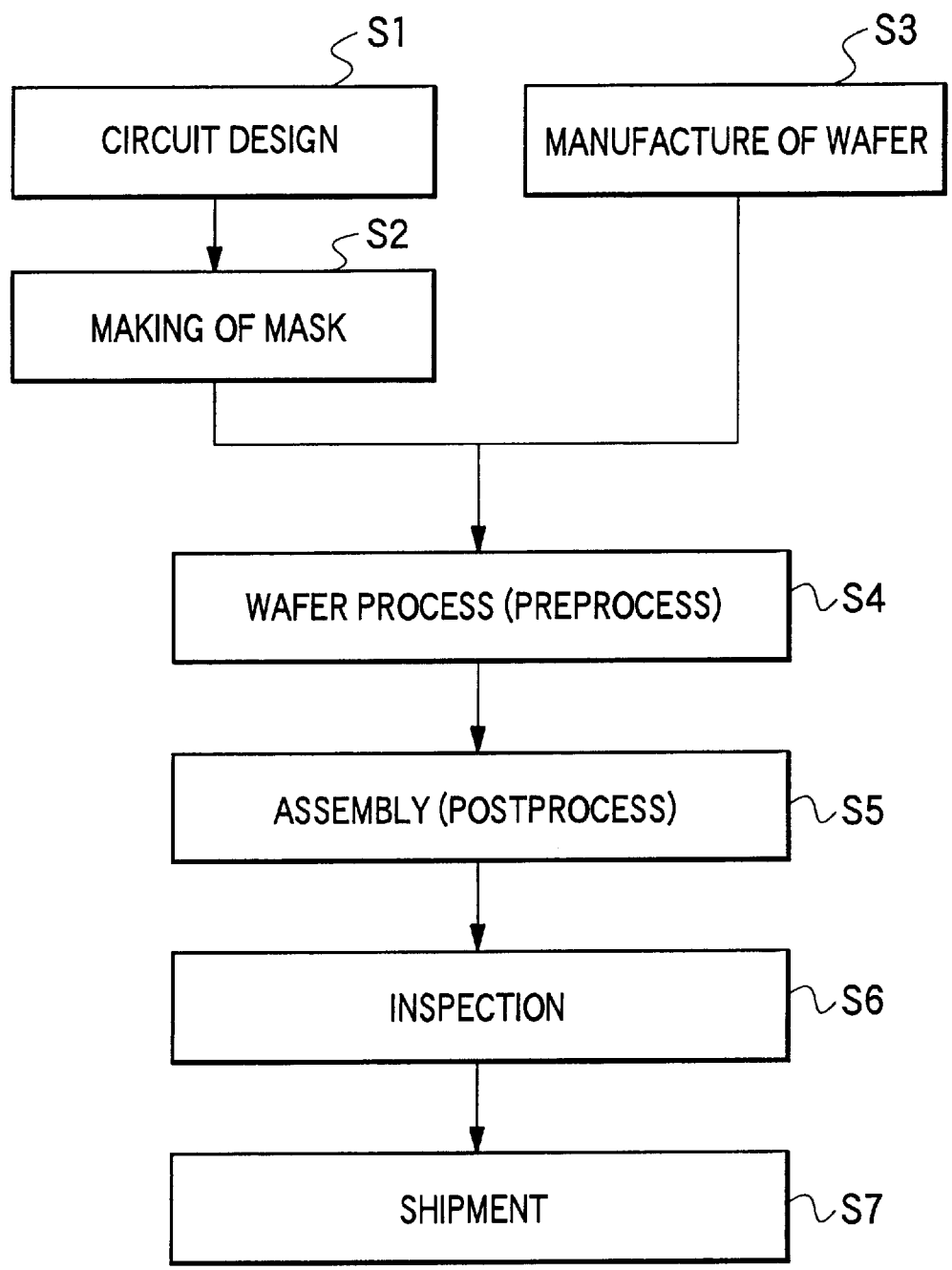
FIG. 7 is a flow chart showing a device manufacturing method according to the invention.

FIG. 7 is a flow chart showing a flow of processes for manufacturing a semiconductor device, such as a semiconductor chip including an IC or an LSI, a liquid crystal panel, a CCD or the like.

At a step S1 (circuit design), a circuit pattern for the semiconductor device is designed. At a step S2 (making of mask), a mask on which the designed circuit pattern is formed is made.

On the other hand, at a step S3 (manufacture of wafer), a wafer is manufactured by using a material such as silicon. At a step S4 (wafer process), which is called a preprocess, an actual circuit is formed on the wafer, by a lithography technique, using the mask and the wafer.

At the next step S5 (assembly), which is called a postprocess, the wafer processed at the step S4 is processed into a semiconductor chip through an assembly process (dicing and bonding), a packaging process (chip sealing), etc.

At a step 6 (inspection), the semiconductor device obtained at the step S5 is inspected by carrying out tests for its operation, its durability, etc. At a step S7 (shipment), the semiconductor device thus completed through the above processes is shipped.

Figure 8:
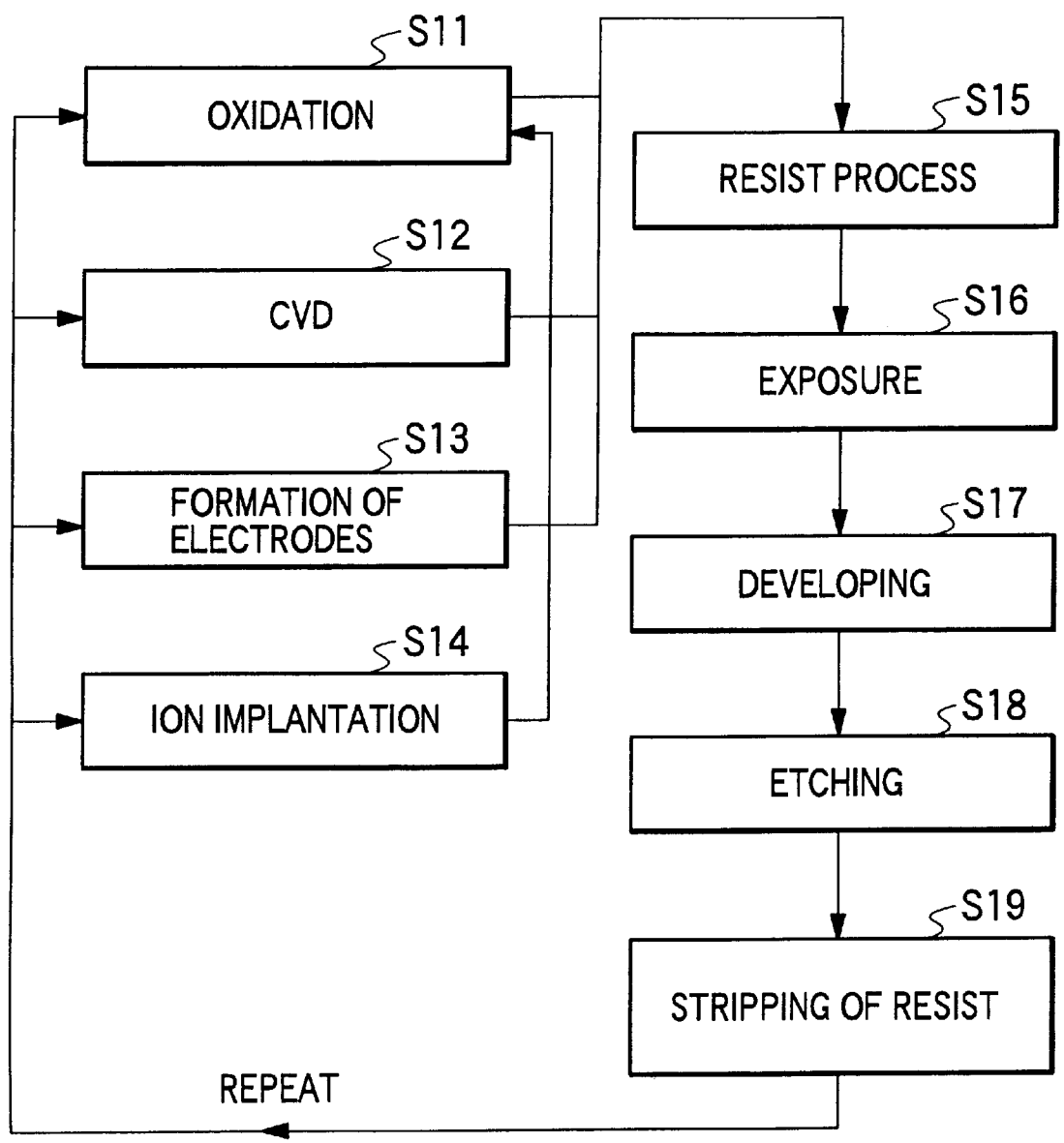
FIG. 8 is another flow chart showing the device manufacturing method according to the invention.

FIG. 8 is a flow chart showing the details of the wafer process of the above step S4. At a step S11 (oxidation), the surface of the wafer is oxidized. At a step S12 (CVD), an insulation film is formed on the surface of the wafer.

At a step S13 (formation of electrodes), electrodes are formed on the wafer by a vapor deposition process. At a step S14 (ion implantation), ions are implanted into the wafer. At a step S15 (resist process), a photosensitive material is coated to the wafer. At a step S16 (exposure), the circuit pattern of the mask is printed to the wafer by carrying out an exposure with the projection exposure apparatus described in the foregoing.

At a step S17 (developing), the exposed wafer is developed. At a step S18 (etching), parts other than the developed resist are scraped off. At a step S19 (stripping of resist), the resist, which has become unnecessary after completion of the etching process, is removed. With the above steps repeated, a multiple circuit pattern is formed on the wafer.

The manufacturing method according to the invention described above facilitates the manufacture of a semiconductor device of a high degree of integration, which has been difficult to attain by the conventional manufacturing method.

What is claimed is:

1. A projection exposure apparatus, comprising:
   a projection optical system for projecting a pattern of a mask onto a substrate; and
   a stage for the substrate arranged to be movable in directions X and Y each of which is perpendicular to an optical axis of said projection optical system and which are perpendicular to each other,
   wherein said projection optical system has a pair of aspherical members, at least one of which is displaceable in a direction P which is perpendicular to the optical axis of said projection optical system and which differs from the directions X and Y, the direction P being at an angle of not less than 10 degrees and not greater than 80 degrees with respect to each of the directions X and Y,
   wherein a shape of an aspheric surface of each of said pair of aspherical members is determined such that a refractive power of said pair of aspherical members functioning as one system obtained at a section including the direction P varies accordingly as a positional relation in the direction P between the aspheric surfaces of said pair of aspherical members varies, said pair of aspherical members functioning as one system having no refractive power at a section including a direction perpendicular to the direction P, and
   wherein a refractive power at the section of said projection optical system is varied by displacing the at least one of said pair of aspherical members in the direction P.

2. A projection exposure apparatus according to claim 1, wherein said pair of aspherical members are displaceable as much as the same amount in respective opposite directions.

3. A projection exposure apparatus according to claim 1, wherein said pair of aspherical members are integrally rotatable around a rotation axis being the optical axis of said projection optical system.

4. A projection exposure apparatus according to claim 1, wherein said projection optical system has a function of varying a magnification thereof in an isotropic manner.

5. A device manufacturing method, comprising the steps of:
   projecting, using a projection optical system, a pattern of a mask onto a substrate;
   arranging a stage for the substrate to be movable in directions X and Y each of which is perpendicular to an optical axis of the projection optical system and which are perpendicular to each other;
   providing the projection optical system with a pair of aspherical members, at least one of which is displaceable in a direction P which is perpendicular to the optical axis of the projection optical system and which differs from the directions X and Y, the direction P being at an angle of not less than 10 degrees and not greater than 80 degrees with respect to each of the directions X and Y, wherein a shape of an aspheric surface of each of the pair of aspherical members is determined such that a refractive power of the pair of aspherical members functioning as one system obtained at a section including the direction P varies accordingly as a positional relation in the direction P between the aspheric surfaces of the pair of aspherical members varies, said pair of aspherical members function as one system having no refractive power at a section including a direction perpendicular to the direction P;
   varying a refractive power at the section of the projection optical system by displacing the at least one of the pair of aspherical members in the direction P;
   exposing a wafer to a device pattern through the projection optical system; and
   developing the exposed wafer.

6. A method according to claim 5, wherein the pair of aspherical members are displaceable as much as the same amount in respective opposite directions.

7. A method according to claim 5, wherein the pair of aspherical members are integrally rotatable around a rotation axis being the optical axis of the projection optical system.

8. A method according to claim 5, wherein the projection optical system has a function of varying a magnification thereof in an isotropic manner.

* * * * *

UNITED STATES PATENT AND TRADEMARK OFFICE
CERTIFICATE OF CORRECTION

PATENT NO. : 6,172,740 B1
DATED : January 9, 2001
INVENTOR(S) : Akiyoshi Suzuki

Page 1 of 1

It is certified that error appears in the above-identified patent and that said Letters Patent is hereby corrected as shown below:

<u>Title page,</u>
<u>Item [56], "References Cited",</u>
Under "U.S. PATENT DOCUMENTS", "5,774,206" should read -- 5,774,205 --.

<u>Column 8,</u>
Line 59, "$3a\Delta p^2+2b\Delta_p+c\Delta+ (d1-d2) +3a\Delta^2 p+b\Delta^2+a\Delta^3$" should read
-- $3a\Delta p^2+2b\Delta p+c\Delta+ (d1-d2) +3a\Delta^2 p+b\Delta^2+a\Delta^3$ --.

<u>Column 10,</u>
Line 34, "is of," should read -- is, of --.

Signed and Sealed this

Thirteenth Day of November, 2001

Attest:

*Nicholas P. Godici*

NICHOLAS P. GODICI
*Attesting Officer*    *Acting Director of the United States Patent and Trademark Office*